United States Patent
Van Gastel

(10) Patent No.: US 7,640,657 B2
(45) Date of Patent: Jan. 5, 2010

(54) PRINTED CIRCUIT COMPONENT PLACEMENT METHOD

(75) Inventor: Josephus Martinus Maria Van Gastel, Eindhoven (NL)

(73) Assignee: Assembleon N.V., Eindhoven (NL)

( * ) Notice: Subject to any disclaimer, the term of this patent is extended or adjusted under 35 U.S.C. 154(b) by 0 days.

(21) Appl. No.: 12/098,840

(22) Filed: Apr. 7, 2008

(65) Prior Publication Data

US 2008/0250635 A1    Oct. 16, 2008

Related U.S. Application Data

(62) Division of application No. 09/594,405, filed on Jun. 15, 2000, now abandoned.

(30) Foreign Application Priority Data

Jun. 16, 1999    (EP) .................................. 99201924

(51) Int. Cl.
*H05K 3/30*        (2006.01)
(52) U.S. Cl. .............................. 29/832; 29/739; 29/740; 29/840
(58) Field of Classification Search .................. 29/739, 29/740, 832, 840
See application file for complete search history.

(56) References Cited

U.S. PATENT DOCUMENTS

| | | |
|---|---|---|
| 5,002,448 A | 3/1991 | Kamijima et al. |
| 5,086,559 A | 2/1992 | Akatsuchi |
| 5,191,702 A | 3/1993 | Goedecke et al. |
| 5,323,528 A | 6/1994 | Baker |
| 5,601,394 A | 2/1997 | Chiappe |
| 5,727,311 A | 3/1998 | Ida |
| 5,778,525 A | 7/1998 | Hata et al. |
| 5,806,174 A | 9/1998 | Itoh |
| 5,839,187 A | 11/1998 | Sato et al. |
| 6,101,709 A | 8/2000 | Shiota |
| 6,199,272 B1 | 3/2001 | Seto et al. |
| 6,588,096 B1 | 7/2003 | Hidese |
| 2002/0042989 A1* | 4/2002 | Kawase et al. ................ 29/832 |
| 2004/0033128 A1* | 2/2004 | Kabeshita et al. ........... 414/935 |
| 2005/0144779 A1* | 7/2005 | Nakamura et al. ............ 29/740 |
| 2006/0000085 A1* | 1/2006 | Kabeshita et al. ............. 29/790 |

FOREIGN PATENT DOCUMENTS

DE    19835876 A    2/1999

(Continued)

*Primary Examiner*—C. J Arbes
(74) *Attorney, Agent, or Firm*—Foley & Lardner LLP

(57) ABSTRACT

A component placement machine includes: a transport device for transporting PCBs in an X-direction; first and a second feeder areas; at least one Y-slide beam that is drivable in the X-direction; and at least two placement heads on each Y-slide beam, which placement heads are independently drivable in the Y-direction and dependently drivable in the X-direction. Each feeder area includes at least one feeder for storing components. Such a machine enables a number of actions to be performed simultaneously. For example, within a certain period of time, a plurality of placement heads can simultaneously pick up components from a feeder, while other placement heads, which previously picked up components, may be moved to desired X-Y positions of the PCB which the previously picked up components may be placed, thereby resulting in an improved output.

2 Claims, 1 Drawing Sheet

FOREIGN PATENT DOCUMENTS

| | | |
|---|---|---|
| JP | 4035099 (A) | 2/1992 |
| JP | 5-13997 | 1/1993 |
| JP | 10079596 (A) | 3/1998 |
| JP | 11054994 | 2/1999 |
| WO | WO 9738567 A1 | 10/1997 |

\* cited by examiner

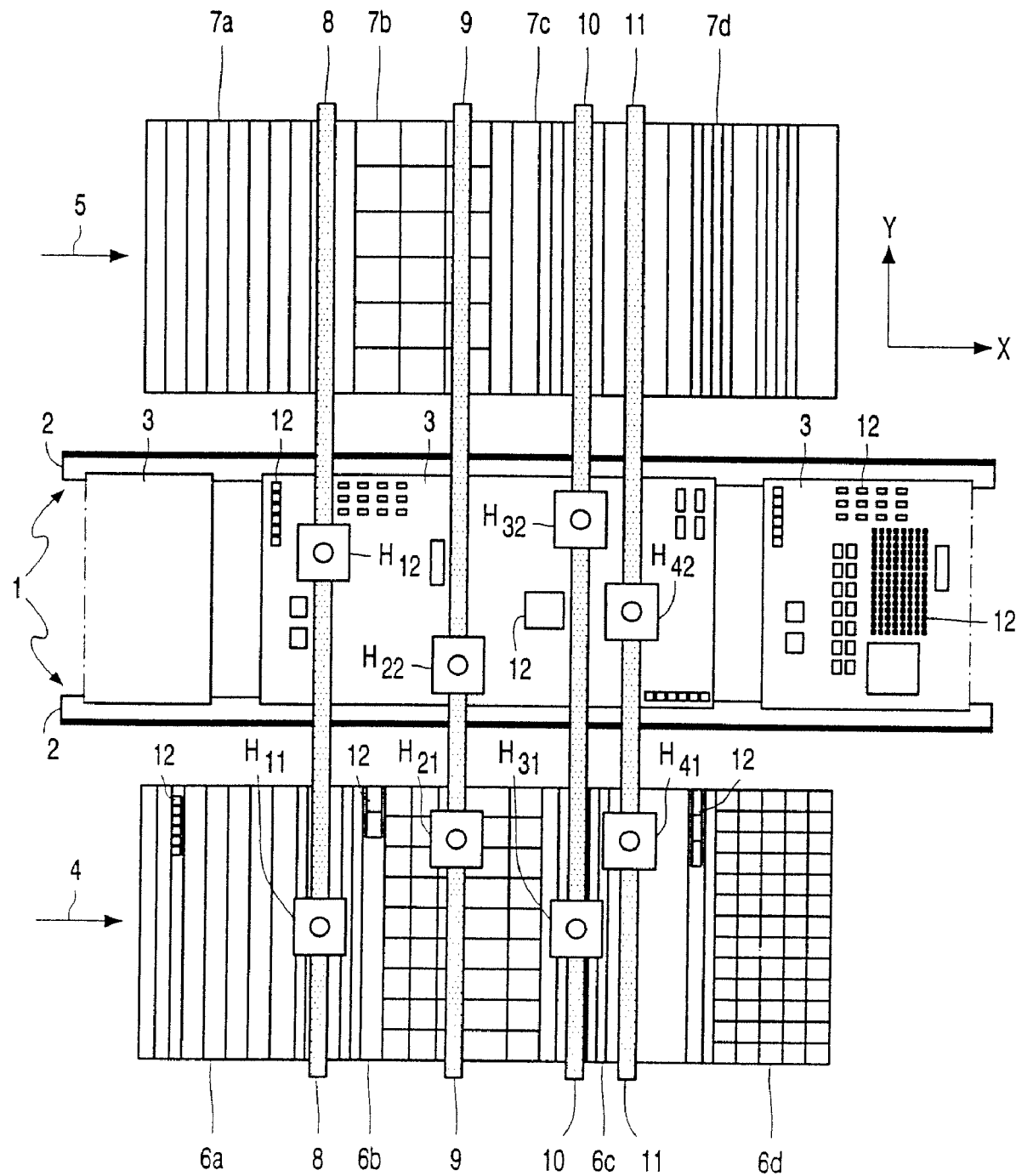

PRINTED CIRCUIT COMPONENT PLACEMENT METHOD

CROSS-REFERENCE TO RELATED APPLICATION

This application is a divisional application of U.S. application Ser. No. 09/594,105, filed Jun. 15, 2000, now abandoned which is incorporated by reference herein in its entirety.

BACKGROUND OF THE INVENTION

The invention relates to a component placement machine for placing components on a printed circuit board, comprising:
- a transport device for transporting printed circuit boards in an X-direction,
- on either side of the transport device, respectively, a first and a second feeder area, in each of which there is at least one feeder with components,
- a Y-slide, which is drivable in the X-direction, and
- a placement head on said Y-slide, which placement head is drivable in a Y-direction.

Such a machine is known from WO-A-9738567. This machine can be very flexibly used for different types of printed circuit boards. The placement head can reach all positions of the feeder area and of the area above a printed circuit board. The transport of printed circuit boards is relatively simple. The printed circuit boards only have to be clamped at the edges (in the X-direction). By means of a camera, the exact position of the printed circuit board can be determined. A drawback of this machine is, however, that the output, i.e. the number of components which can be placed per unit of time, is limited.

Placement machines by means of which very many components (60,000-90,000 comp/h) can be placed on printed circuit boards are known. Such machines have a large number of fixed Y-slides, each slide having a placement head which can be moved in the Y-direction with a large stroke and in the X-direction with a small stroke. These machines have a so-called indexed transport system for the printed circuit boards, i.e. the printed circuit boards are always transported over a fixed distance in the X-direction. Such a transport system includes a slide on which there are a number of positioning pins which are inserted into holes of the printed circuit boards, whereafter said positioning pins advance the printed circuit boards simultaneously over a predetermined distance in the X-direction, after which the printed circuit boards are supported at the side edges, and subsequently the pins are withdrawn from the holes and the slide returns to its starting position. In one placement period, generally components can be placed only on a part of the printed circuit board. After the printed circuit boards have been advanced in an indexed manner, components can be placed on a next part of the printed circuit board in the subsequent placement period. The fixed Y-slide, the limited stroke of the placement head in the X-direction and the indexed transport system for the printed circuit boards contribute substantially to achieving a high output. A drawback of such machines resides in the limited flexibility, i.e. when other types of printed circuit boards have to be provided with components, a number of machine parts have to be moved or replaced, whereafter the new setting has to be re-calibrated. These changes relate particularly to the parts necessary for supporting and transporting the printed circuit boards. It takes approximately 2 to 4 hours to carry out such changes. During this period of time, the machine is idle.

Another drawback resides in that such machines are sensitive to cluster formation. That is to say, if the components are not uniformly distributed over the printed circuit board, but instead are located so as to form concentrations (clusters), the output is adversely affected.

SUMMARY OF THE INVENTION

It is an object of the invention to provide a component placement machine having a large output, i.e. the number of components which can be placed per unit of time is relatively large, while the machine still exhibits a great flexibility.

A further object of the invention is to provide a method of placing components on printed circuit boards by means of a component placement machine in accordance with the invention.

To achieve this, the component placement machine in accordance with the invention is characterized in that the Y-slide is provided with at least two placement heads which can be independently driven in a Y-direction.

Such a machine concept makes it possible to pick up a component from one of the feeders with one of the placement heads while, simultaneously, one of the other placement heads is used to make preparations for the placement of a component on the printed circuit board. Conversely, such a machine concept also makes it possible to place a component onto a printed circuit board by means of one of the placement heads while, simultaneously, preparations are made with one of the other placement heads to pick up a component from one of the feeders. It will be clear that, as a result thereof, the output of the machine is considerably increased. The machine also has a great flexibility because each placement head can reach every part of at least a number of feeders and every part of the printed circuit board. Many different printed circuit boards, particularly as regards the dimensions, can be used because a relatively simple transport system for the printed circuit boards is sufficient. Consequently, for example, an indexed printed circuit board transport can be dispensed with.

A further increase of the output can be obtained when the machine is provided with a number of Y-slides, which are independently drivable in the X-direction, each Y-slide being provided with at least two placement heads. By virtue thereof, a number of placement heads can pick up components simultaneously from at least one feeder or place components simultaneously on a printed circuit board in the desired X-Y position.

A method of placing components on a printed circuit board using an above-described component-placement machine is characterized in that
  in a first period of time, a first placement head moves to a desired X-Y position above a first feeder and, subsequently, picks up a component from the first feeder, a second placement head moves along the Y-slide to a desired Y-position so as to prepare for the placement of a previously picked-up component on the printed circuit board,
  in a second period of time following the first period of time, the second placement head moves to a desired X-Y position above the printed circuit board and subsequently places the component on the printed circuit board,
  in a third period of time following the second period of time, the second placement head moves to a desired X-Y position above a second feeder and, subsequently, picks up a component from the second feeder, the first placement head moves along the Y-slide to a desired Y-position so as to prepare for the placement onto the printed circuit board of the component picked up in the first period of time, and in a fourth period of time following the third period of time, the first placement head moves to a desired X-Y position above the printed circuit board and, subsequently, places the component on the printed circuit board.

If the placement machine is provided with a number of Y-slides, which are independently drivable in the X-direction, each Y-slide being provided with at least two placement heads, the method is characterized in that in a first period of time, a first series of placement heads moves to a desired X-Y position above a first feeder and, subsequently, simultaneously picks up components from the first feeder, a second series of placement heads moves along the Y-slide to a desired Y-position so as to prepare for the placement on the printed circuit board of previously picked-up components, in a second period of time following the first period of time, the second series of placement heads moves to a desired X-Y position above the printed circuit board and, subsequently, places the components simultaneously on the printed circuit board, in a third period of time following the second period of time, the second series of placement heads moves to a desired X-Y position above a second feeder and, subsequently, simultaneously picks up components from the second feeder, the first series of placement heads moves along the Y-slide to a desired Y-position so as to prepare for the placement on the printed circuit board of the components picked up in the first period of time, and in a fourth period of time following the third period of time, the first series of placement heads moves to a desired X-Y position above the printed circuit board and, subsequently, places the components simultaneously on the printed circuit board.

BRIEF DESCRIPTION OF THE DRAWING

These and other aspects of the invention will be elucidated by means of a single drawing which is a diagrammatic plan view of a component placement machine.

DESCRIPTION OF THE PREFERRED EMBODIMENTS

The transport device 1 is represented by two transport bars 2 over which printed circuit boards 3 are transported. The transport mechanism used for this purpose is not shown. A clamping mechanism used to clamp the printed circuit boards at the edges is not shown either. On either side of the transport device there is, respectively, a first and a second feeder area 4, 5. Each feeder area comprises a number of feeders, for example $6_a$, $6_b$, $6_c$, $6_d$ and $7_a$, $7_b$, $7_c$, $7_d$, respectively, with components. Above the printed circuit boards and the feeders there are Y-slides which are independently drivable in the X-direction. In this example, there are four Y-slides 8-11. On each Y-slide there are two placement heads $H_{xx}$. On the slide 8 there are the placement heads $H_{11}$ and $H_{12}$, on the slide 9 there are the heads $H_{21}$ and $H_{22}$, on the slide 10 there are the heads $H_{31}$ and $H_{32}$, and on the slide 11 there are the heads $H_{41}$ and $H_{42}$.

The placement of components 12 on a printed circuit board 3 takes place as follows:

It is assumed that the placement heads $H_{12}$, $H_{22}$, $H_{32}$ and $H_{42}$ already have picked up components 12 from the feeders $7_a$, $7_b$, $7_c$, $7_d$.

In a first period of time, the placement heads $H_{11}$, $H_{21}$, $H_{31}$ and $H_{41}$ each move to a desired X-Y position above one of the feeders $6_a$, $6_b$, $6_c$, $6_d$ and, subsequently, simultaneously pick up a component 12 from the feeder. In this period of time, the placement heads $H_{12}$, $H_{22}$, $H_{32}$ and $H_{42}$, which have already picked up components, also move to a desired Y-position above the printed circuit board 3. These Y-positions correspond to the Y-position of the place where the component in question must be placed on the printed circuit board.

In the second period of time, the placement heads $H_{12}$, $H_{22}$, $H_{32}$ and $H_{42}$ move on to the desired X-position above the printed circuit board, so that the placement heads are each situated exactly above the X-Y position where the components must be placed on the printed circuit board. Subsequently, the components in question are simultaneously placed on the printed circuit board.

In the third period of time, the placement heads $H_{12}$, $H_{22}$, $H_{32}$ and $H_{42}$ each move to a desired X-Y position above one of the feeders $7_a$, $7_b$, $7_c$, $7_d$ and subsequently simultaneously pick up a component 12 from the feeder. In this third period of time, the placement heads $H_{11}$, $H_{21}$, $H_{31}$ and $H_{41}$ also move, with the components picked up in the first period of time, to a desired Y-position above the printed circuit board 3. These Y-positions correspond to the Y-position of the place where the component in question must be placed on the printed circuit board.

In the fourth period of time, the placement heads $H_{11}$, $H_{21}$, $H_{31}$ and $H_{41}$ move on to the desired X-position above the printed circuit board, so that the placement heads are each situated exactly above the X-Y position where the components must be placed on the printed circuit board. Subsequently, the components in question are simultaneously placed on the printed circuit board.

Subsequently, the procedure of the first period of time is repeated, etc.

The placement machine can be easily extended, for example, by providing more Y-slides, in particular by applying a modular build-up. In addition, it is possible to apply a plurality of pick-up elements per placement head. Pick-up elements are, for example, suction pipettes by means of which components are picked up and placed.

What is claimed is:

1. A method of placing components on a printed circuit board by means of a component placement machine, the method comprising the steps of:

in a first period of time:

moving a first placement head to a desired X-Y position above a first feeder area; picking-up a component from the first feeder area using the first placement head; and moving a second placement head along a first Y-slide to a desired Y-position so as to prepare for the placement of a component previously picked up by the second placement head on the printed circuit board;

in a second period of time following the first period of time:

moving the second placement head to a desired X-Y position above the printed circuit board; and placing the component previously picked up by the second placement head on the printed circuit board;

in a third period of time following the second period of time:

moving the second placement head to a desired X-Y position above a second feeder; area;

picking up a component from the second feeder area using the second placement head; and moving the first placement head along the first Y-slide to a desired Y-position so as to prepare for the placement on the printed circuit board of the component previously picked up by the first placement head in the first period of time; and in a fourth period of time following the third period of time:

moving the first placement head to a desired X-Y position above the printed circuit board; and placing the component previously picked up by the first placement head on the printed circuit board.

2. The method of claim 1, further comprising the steps of:

in the first period of time:

moving a first series of placement heads to respective desired X-Y positions above the first feeder area, the first series including the first placement head on the first Y-slide and a third placement head on a second Y-slide;

picking up components from the first feeder area using the first series of placement heads; and moving a second series of placement heads along the first and second Y-slides to respective desired Y-positions so as to prepare for the placement on the printed circuit board of components previously picked up by the second series of placement heads, the second series including the second placement head on the first Y-slide and a fourth placement head on the second Y-slide;

in the second period of time following the first period of time:

moving the second series of placement heads to respective desired X-Y positions above the printed circuit board; and placing the components previously picked up by the second series of placement heads simultaneously on the printed circuit board;

in the third period of time following the second period of time:

moving the second series of placement heads to respective desired X-Y positions above the second feeder area;

picking up components from the second feeder area using the second series of placement heads; and moving the first series of placement heads along the first and second Y-slides to respective desired Y-positions so as to prepare for the placement on the printed circuit board of the components previously picked up in the first period of time by the first series of placement heads; and in the fourth period of time following the third period of time:

moving the first series of placement heads to respective desired X-Y positions above the printed circuit board; and placing the components previously picked up by the first series of placement heads simultaneously on the printed circuit board.

* * * * *